(12) United States Patent
Gross et al.

(10) Patent No.: US 11,381,260 B2
(45) Date of Patent: Jul. 5, 2022

(54) ARCHITECTURE FOR GUESSING RANDOM ADDITIVE NOISE DECODING (GRAND)

(71) Applicant: THE ROYAL INSTITUTION FOR THE ADVANCEMENT OF LEARNING/MCGILL UNIVERSITY, Montréal (CA)

(72) Inventors: Warren J. Gross, Cote-St-Luc (CA); Syed Mohsin Abbas, Montreal (CA); Thibaud Tonnellier, Ramonville-Saint-Agne (FR)

(73) Assignee: THE ROYAL INSTITUTION FOR THE ADVANCEMENT OF LEARNING / MCGILL UNIVERSITY, Montreal (CA)

( * ) Notice: Subject to any disclaimer, the term of this patent is extended or adjusted under 35 U.S.C. 154(b) by 0 days.

(21) Appl. No.: 17/330,960

(22) Filed: May 26, 2021

(65) Prior Publication Data

US 2021/0376953 A1    Dec. 2, 2021

Related U.S. Application Data

(60) Provisional application No. 63/030,415, filed on May 27, 2020.

(51) Int. Cl.
*H03M 13/45* (2006.01)
*H04L 1/00* (2006.01)
*H03M 13/39* (2006.01)
*H03M 13/15* (2006.01)

(52) U.S. Cl.
CPC ..... *H03M 13/455* (2013.01); *H03M 13/1575* (2013.01); *H03M 13/39* (2013.01); *H03M 13/451* (2013.01); *H04L 1/0045* (2013.01)

(58) Field of Classification Search
CPC .......................... H03M 13/455; H03M 13/451
See application file for complete search history.

(56) References Cited

U.S. PATENT DOCUMENTS

| 5,010,554 A * | 4/1991 | Bechtel ................ H04L 1/0057 |
| | | 714/759 |
| 8,281,221 B2 * | 10/2012 | Sakimura ............ G11C 11/1675 |
| | | 714/764 |
| 2008/0148129 A1 * | 6/2008 | Moon .................. H03M 13/15 |
| | | 714/781 |

(Continued)

OTHER PUBLICATIONS

C. E. Shannon, "A mathematical theory of communication," Bell Syst. Tech. J., vol. 27, pp. 379-423, Jul.-Oct. 1948.

(Continued)

*Primary Examiner* — Joseph D Torres
(74) *Attorney, Agent, or Firm* — Norton Rose Fulbright Canada LLP

(57) ABSTRACT

There is provided a method comprising, at a data receiver, receiving a channel codeword from a data sender over a noisy data channel, generating a plurality of candidate error patterns, the plurality of candidate error patterns comprising a plurality of one-bit error patterns and a plurality of multiple-bit error patterns generated from the plurality of one-bit error patterns, evaluating the plurality of candidate error patterns for codebook membership, based on the channel codeword, and outputting an estimated codeword when a codebook membership constraint is satisfied for a given candidate error pattern.

20 Claims, 8 Drawing Sheets

(56) References Cited

U.S. PATENT DOCUMENTS

2011/0016371 A1\* 1/2011 Sakimura ............ G06F 11/1008
714/763

OTHER PUBLICATIONS

C. Berrou, A. Glavieux, and P. Thitimajshima, "Near Shannon limit error-correcting coding and decoding: Turbo-codes. 1," in Proc. IEEE Int. Conf. Commun. (ICC), May 1993, pp. 1064-1070.

E. Arikan, "Channel polarization: A method for constructing capacity achieving codes for symmetric binary-input memory less channels," IEEE Trans. Inf. Theory, vol. 55, No. 7, pp. 3051-3073, 2009.

3rd Generation Partnership Project; Technical Specification Group Radio Access Network; NR; Multiplexing and Channel Coding (Release 15), 3GPP TS 38.212 V15.7.0, Sep. 2019.

E. Sasoglu, E. Telatar, and E. Arikan, "Polarization for arbitrary discrete memoryless channels," in Proc. IEEE Inf. Theory Workshop (ITW), pp. 144-148, 2009.

K. R. Duffy, J. Li and M. Medard, "Capacity-Achieving Guessing Ran—dom Additive Noise Decoding," in IEEE Transactions on Information Theory, vol. 65, No. 7, pp. 4023-4040, Jul. 2019.

Hari Balakrishnan, Christopher Terman, and George Verghese, "Bits, Signals, and Packets: An introduction to Digital Communications and works" Chapter 6, Massachusetts Institute of Technology (MIT) (2012).

K. R. Duffy and M. Medard, "Guessing random additive noise decoding with soft detection symbol reliability information—SGRAND," in IEEE Int. Symp. on Inf. Theory, 2019.

K. R. Duffy, J. Li, and M. Medard, "Guessing noise, not codewords," in IEEE Int. Symp. on Inf. Theory, 2018.

\* cited by examiner

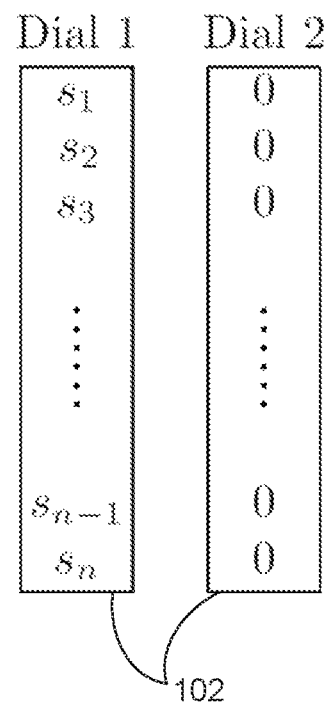
FIG. 2
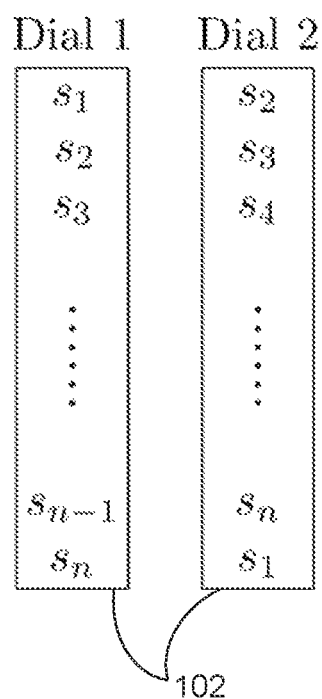 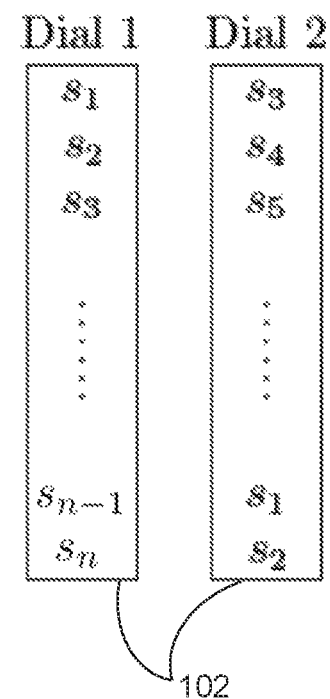
FIG. 3A                FIG. 3B

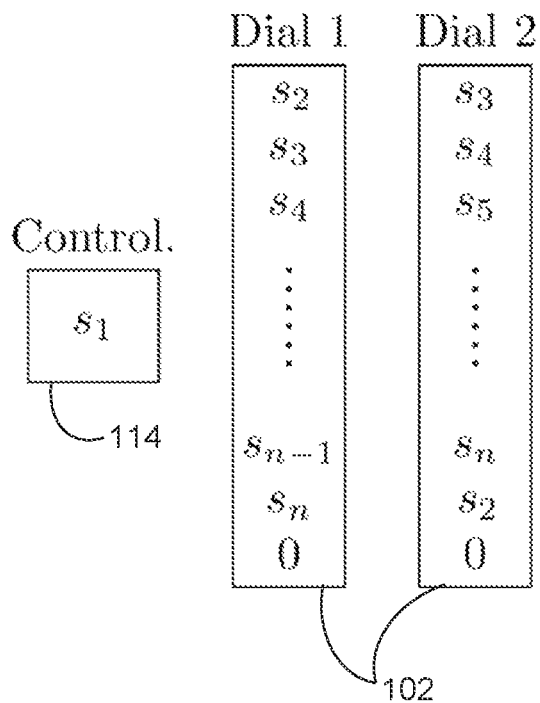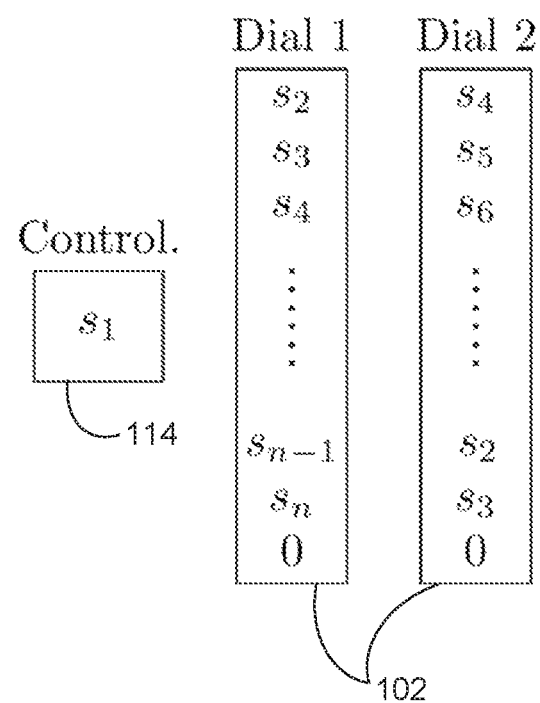
FIG. 4A  FIG. 4B
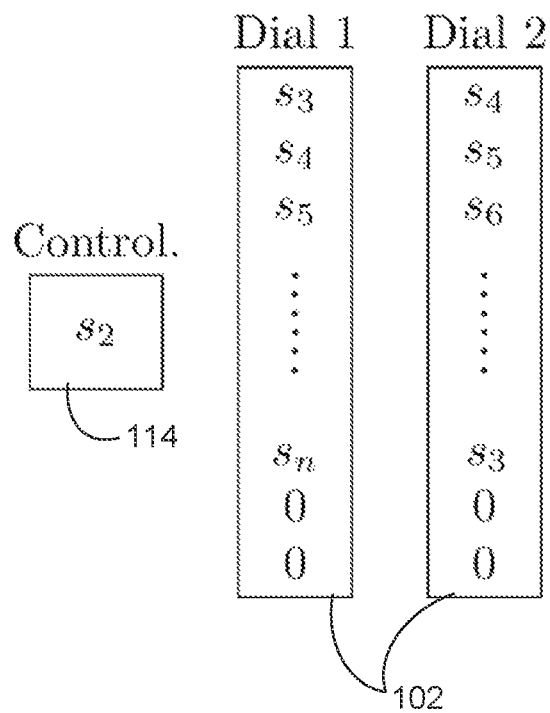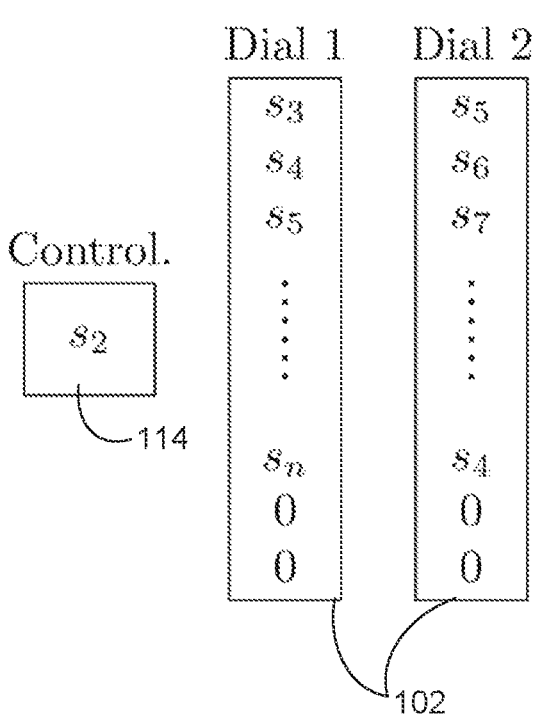
FIG. 4C  FIG. 4D

ARCHITECTURE FOR GUESSING RANDOM ADDITIVE NOISE DECODING (GRAND)

CROSS-REFERENCE TO RELATED APPLICATIONS

This patent application claims priority of U.S. provisional Application Ser. No. 63/030,415, filed on May 27, 2020, the entire contents of which are hereby incorporated by reference.

TECHNICAL FIELD

The present disclosure relates to the field of decoding data, and more particularly to decoding data using noise guessing.

BACKGROUND OF THE ART

Guessing Random Additive Noise Decoding (GRAND) is as a Maximum Likelihood (ML) decoding technique for forward error-correcting block codes. Using GRAND, a block code can be decoded based on guessing noise. In particular, added noise is guessed by flipping bit locations of a received noisy codeword and codebook membership of the received codeword can then be checked to correct the noise effect. However, this technique requires a very large number of codebook membership queries, leading to increased decoding latency and hardware requirements. There is therefore room for improvement.

SUMMARY

In accordance with a first broad aspect, there is provided a method comprising, at a data receiver, receiving a channel codeword from a data sender over a noisy data channel, generating a plurality of candidate error patterns, the plurality of candidate error patterns comprising a plurality of one-bit error patterns and a plurality of multiple-bit error patterns generated from the plurality of one-bit error patterns, evaluating the plurality of candidate error patterns for codebook membership, based on the channel codeword, and outputting an estimated codeword when a codebook membership constraint is satisfied for a given candidate error pattern.

In accordance with a second broad aspect, there is provided a data receiver comprising a receiving unit configured for receiving a channel codeword from a data sender over a noisy data channel, an error pattern generation unit configured for generating a plurality of candidate error patterns, the plurality of candidate error patterns comprising a plurality of one-bit error patterns and a plurality of multiple-bit error patterns generated from the plurality of one-bit error patterns, a codebook membership evaluation unit configured for evaluating the plurality of candidate error patterns for codebook membership, based on the channel codeword, and an output unit configured for outputting an estimated codeword when a codebook membership constraint is satisfied for a given candidate error pattern.

BRIEF DESCRIPTION OF THE DRAWINGS

Further features and advantages of the present invention will become apparent from the following detailed description, taken in combination with the appended drawings, in which:

FIG. 2 is a schematic diagram showing the contents of the dials of FIG. 1B for evaluating one-bit-flip error patterns, in accordance with an illustrative embodiment;

FIG. 3A and FIG. 3B are schematic diagrams showing the contents of the dials of FIG. 1B for evaluating two-bit-flip error patterns, in accordance with an illustrative embodiment;

FIG. 4A, FIG. 4B, FIG. 4C, and FIG. 4D are schematic diagrams showing the contents of the dials of FIG. 1B for evaluating three-bit-flip error patterns, in accordance with an illustrative embodiment;

It will be noted that throughout the appended drawings, like features are identified by like reference numerals.

DETAILED DESCRIPTION

Figure 1A:
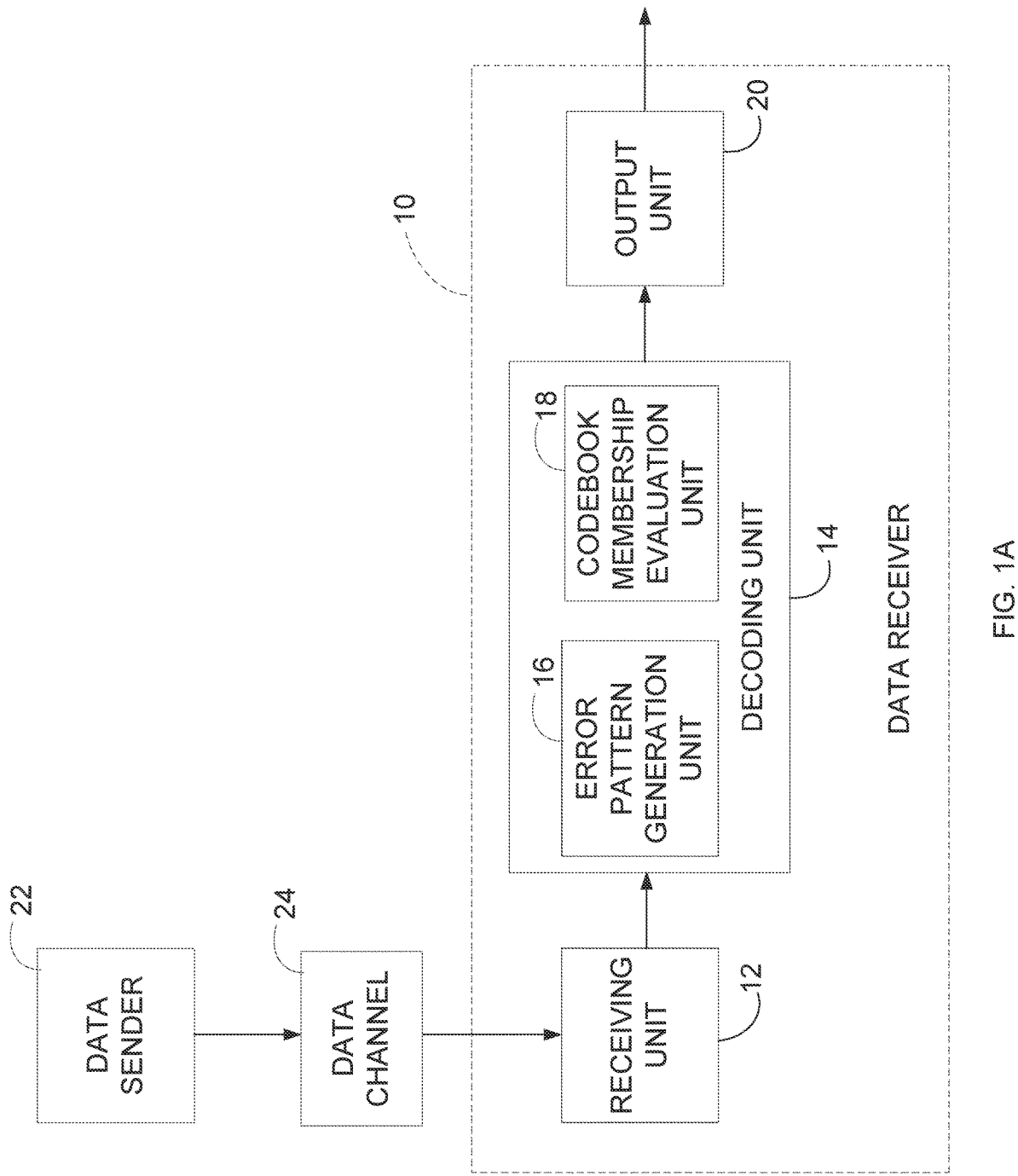
FIG. 1A is a block diagram of a data receiver, in accordance with an illustrative embodiment.

Herein described are methods and systems for decoding data using noise guessing. The systems and methods described herein apply to a context in which a data sender sends data (i.e. a sequence of symbols referred to herein as a 'block' or 'block code') toward a data receiver using a communication medium referred to herein as a 'data channel'. The data sender and the data receiver operate using a shared set of blocks, or a description of such a set of blocks, referred to as a 'codebook' which consists of a number of codewords (i.e. a 'codeword' refers to a block in the codebook). The input to the data channel or 'channel input' (i.e. the block sent by the data sender into the data channel) may however differ from the corresponding output of the data channel or 'channel output' (i.e. a corresponding block received by the data receiver from the data channel) due to an error (also referred to herein as 'noise') caused by transient passage of the block through the data channel (referred to herein as a 'noisy' data channel).

In order for the data receiver to correct the noise that alters the channel input, it is proposed herein to decode block codes based on guessing noise, using a technique referred to herein as Guessing Random Additive Noise Decoding (GRAND) technique. In particular, as will be described further below, it is proposed herein to use circular shift registers (provided at a decoder of the data receiver) to generate noise sequences (also referred to herein as candidate 'error patterns'). The decoder then successively evaluates the candidate error patterns for codebook membership by sequentially removing the noise sequences from the signal received at the data receiver and querying whether the sequence that remains is an element of the codebook. The decoder performs Maximum Likelihood (ML) decoding, or an approximation thereof, and declares the first result that matches the codebook (i.e. satisfies a so-called 'codebook membership constraint'), with a probability approaching one (1), as the maximum likelihood codeword. In one embodiment, in order to limit the number of codebook membership queries, it is proposed herein to implement a GRAND with Abandonment (GRANDAB) technique, in which the decoder limits the number of codebook membership queries and declares an error if none of them satisfies the codebook membership constraint, as will be described further below.

As used herein, matrices are denoted by M, vectors are denoted by v, the transpose operator is denoted by τ, the number of k-combinations from a given set of n elements is noted by $$\binom{n}{k},$$

$\mathbb{1}_n$ is the indicator vector where all locations except the $n^{th}$ are 0 and the $n^{th}$ is 1), and all indices start at 1. As understood by those skilled in the art, a (n, k) linear block code is characterized by a generator matrix (G) and a parity check matrix (H), with a constraint (or codebook membership constraint) on a codeword (x) such that $Hx^\tau=0$.

As understood by those skilled in the art, given a noisy received vector r, GRAND proceeds with guessing the n-bit channel induced noise vector (e), such that the following constraint is satisfied:

$$H \cdot (r \oplus e)^\tau = 0 \quad (1)$$

where the "⊕" sign represents the exclusive-or (XOR) operation.

The GRAND algorithm generates a sequence of most likely error vectors (e) and checks the combination of r⊕e for codebook membership. GRAND declares r⊕e as the decoded codeword when the code book membership constraint from equation (1) is satisfied.

As discussed herein above, GRANDAB puts a limit on the number of code book membership queries, such that GRANDAB abandons the guessing procedure if more than a preset number of queries has been exceeded. The predetermined number of queries (or threshold) may be set based on a number of factors including, but not limited to, hardware constraints and noise characteristics of the data channel. The predetermined number of queries may also be set to avoid excessive guessing or to achieve a target abandonment probability.

In particular, in one embodiment, GRANDAB can limit the Hamming weight of the considered error patterns. As a result, the maximum number of queries for a code of length n when the Hamming weight of the considered error patterns does not exceed t is given by:

$$\sum_{i=1}^{t} \binom{n}{i} \quad (2)$$

In that case, the notation GRANDAB (AB=t), which refers to the fact that the Hamming weight of the considered error patterns does not exceed t, is used.

In one embodiment, for any block code of length n=128, GRANDAB (AB=3), requires $$\binom{128}{1}+\binom{128}{2}+\binom{128}{3}=349632$$

codebook membership queries in the worst case.

Figure 1B:
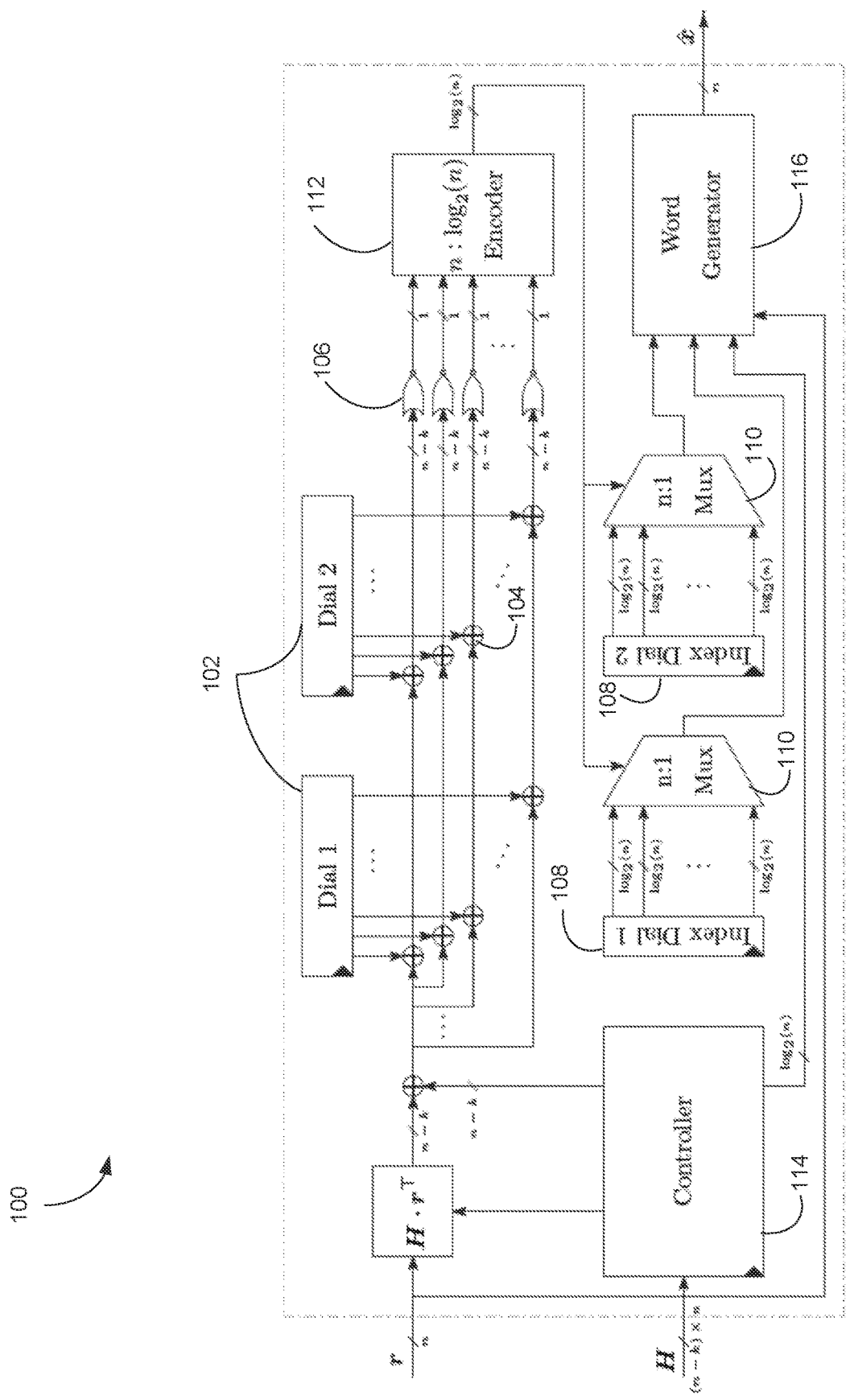
FIG. 1B is a schematic diagram of an architecture for the data receiver of FIG. 1A, in accordance with an illustrative embodiment.

Referring now to FIG. 1A and FIG. 1B, a data receiver 10 used for decoding data using GRAND, will now be described in accordance with one embodiment. The data receiver 10 may be implemented using a combination of hardware and software components. In one embodiment, the data receiver 10 comprises a receiving unit 12, a decoding unit 14 comprising an error pattern generation unit 16 and a codebook membership evaluation unit 18, and an output unit 20. The receiving unit 12 is configured to receive a channel codeword from a data sender 22 over a noisy data channel 24. The data sender 22 may be any device capable of transmitting data (e.g., data packets) to another device, using the data channel 24, and the data receiver 10 may be any device of receiving data (e.g., data packets) from another device, using the data channel 24. The data channel 24 may be any suitable communication medium (or plurality of coupled media) capable of communicating data packets between data sender(s) and data receiver(s). The data channel 24 includes, but is not limited to, an analog channel, a digital channel, and any combination thereof.

The receiving unit 12 may comprise any suitable component(s) including, but not limited to, a network interface card or controller (NIC). The error pattern generation unit 16 is configured to generate a plurality of error patterns comprising a plurality of one-bit error patterns and a plurality of multiple-bit error patterns generated from the plurality of one-bit error patterns. The codebook membership evaluation unit 18 is configured to evaluate the plurality of error patterns for codebook membership, based on the channel codeword. The output unit 20 is then configured to output an estimated codeword when the codebook membership evaluation unit 18 determines that a codebook membership constraint is satisfied for a given error pattern. As will be discussed further below, in one embodiment illustrated in FIG. 1B, the output unit 20 comprises a word generator (reference 116 in FIG. 1B) and the decoding unit 14 is implemented using a plurality of circular (or cyclic) shift registers (references 102 and 108 in FIG. 1B), a plurality of XOR gates 104, a plurality of NOR gates 106, a plurality of multiplexers 110, a priority encoder 112, and a controller 114.

FIG. 1B illustrates an architecture 100 for the data receiver 10, in accordance with one embodiment. For a code length of n, the architecture 100 uses a plurality of n×(n−k) circular (or cyclic) shift registers (also referred to herein as 'dials') 102, 2×n+1 (n−k)-bit-wide XOR gates 104, a plurality of NOR gates 106, a plurality of circular shift registers (also referred to herein as 'index dials') 108, a plurality of multiplexers 110, a n-to-$\log_2$n priority encoder 112, a controller 114, and a word generator 116. In one embodiment, for a code length of n=128, the architecture 100 uses two (2) 128×32-bit dials 102, 257 32-bit-wide XOR gates 104, 128 NOR gates 106, two (2) 128×7-bit index dials 108, two (2) 128×1 multiplexers 110, a 128-to-7 priority encoder 112, the controller 114, and the word generator 116. The architecture 100 may be implemented in any suitable manner including, but not limited to, using Very large scale integration (VLSI) design and hardware description languages, such as Verilog HDL (VHDL), and synthesized in any suitable manner including, but not limited to, using the Synopsys Design Compiler using the TSMC CMOS 65-nm library. Other embodiments may apply.

The proposed architecture 100 may be used with any codebook including, but not limited to, a random codebook, a random linear codebook, and a standard linear codebook (Hamming Code-book, Low Density Parity Check (LDPC), etc). In one embodiment, the proposed architecture 100 may be used to perform GRANDAB decoding (AB=3) for linear codes having a length of n=128 and a code rate between 0.75 and 1. Thus, the length of the syndromes may be constrained to the interval $[\![10..32]\!]$. It should however be understood that any other suitable number of bit flips, code length, and code rate may apply. For example, the systems and methods described herein may apply to noise sequences having more than three (3) bit flips (AB>3). The systems and methods described herein may also be applied to code having a length n other than 128, including, but not limited to, 256, 512, etc. Since GRAND decoding is agnostic to the underlying channel code, it should be understood that the proposed architecture 100 may be used to decode any linear block code conform with given length and rate constraints.

Exploiting the linearity of the codes under consideration, the computations described herein above with reference to GRAND and GRANDAB will now be reformulated with reference to the architecture 100.

For one bit-flip error patterns with $\mathbb{1}_i$, with $i \in [\![1..n]\!]$, using the distributivity rule, equation (1) can be written as:

$$H \cdot (r \oplus \mathbb{1}_i)^\tau = H \cdot r^\tau \oplus H \cdot \mathbb{1}_i^\tau \quad (3)$$

where $H \cdot r^\tau$ is the (n−k)-bits syndrome associated with the received vector r and $H \cdot \mathbb{1}_i^\tau$ is the (n−k)-bits syndrome associated with the one bit-flip error pattern $\mathbb{1}_i$.

Noticing that two bit-flips error patterns $\mathbb{1}_{i,j}$, with $i \in [\![1..n]\!]$, $j \in [\![1..n]\!]$ and $i \neq j$, can be written as $\mathbb{1}_{i,j} = \mathbb{1}_i \oplus \mathbb{1}_j$, equation (1) can be expressed as:

$$H \cdot (r \oplus \mathbb{1}_{i,j})^\tau = H \cdot r^\tau \oplus H \cdot \mathbb{1}_i^\tau \oplus H \cdot \mathbb{1}_j^\tau \quad (4)$$

Similarly, three-bit-flips error patterns $\mathbb{1}_{i,j,k}$, where i, j and k are the flipped bit positions, can be checked for codebook membership with:

$$H \cdot (r \oplus \mathbb{1}_{i,j,k})^\tau = H \cdot r^\tau \oplus H \cdot \mathbb{1}_i^\tau \oplus H \cdot \mathbb{1}_j^\tau \oplus H \cdot \mathbb{1}_k^\tau \quad (5)$$

As will be described further below, using the architecture 100, it is possible to compute all queries corresponding to multiple bit-flips by combining several one bit-flip noise sequence syndromes. In the following, $s_i$ is denoted as the syndrome corresponding to the one-bit-flip error pattern at location i: $s_i = H \cdot \mathbb{1}_i^\tau$, which also corresponds to the $i^{th}$ column of the parity check matrix.

As will be discussed further below, in one embodiment, the scheduling of the proposed architecture 100 first comprises computing the syndrome ($H \cdot r^\tau$) of the received word. All error patterns with a Hamming weight of 1 are then independently combined with the syndrome of the received word. Next, Hamming weights of 2 and 3 are considered, respectively. During the iterations of any of these decoding steps, when equation (1) results in a zero, the corresponding estimated word is the output and the procedure is terminated.

Referring back to FIG. 1B, the input to the architecture 100 is a hard decision vector r (i.e. the channel output received at the receiving unit 12 of the data receiver 10) of length n and its output (generated by the word generator 116) is the estimated word $\hat{x}$ (i.e. the channel input codeword as presumed by the decoder of the data receiver 10), padded with zeros to match the length of n. For the sake of clarity, control and clock signals are omitted from FIG. 1B. The parity check matrix (H) may be provided as an input to the architecture 100 (i.e. may be loaded at an input of the controller 114) at any time, to support any code given the length and rate constraints. The data path of the architecture 100 consists essentially of the interconnection through the XOR gates 104 associated with the dials 102, the syndrome of the received word, and the syndrome provided by the controller 114.

In order to efficiently generate the different error patterns, the architecture 100 is based on circular shift registers or dials 102. As used herein, the term 'dial' refers to a n×(n−k)-bit circular shift register which stores n syndromes associated with one-bit-flip error patterns ($s_i$). In one embodiment, for a code length of n=128, the dial is a 128×32-bit register which stores n syndromes associated with the one-bit-flip error patterns ($s_i$). Each dial as in 102 is configured such that its serial input is connected to its last output, giving the dial 102 the ability to shift its content in a cyclic manner at each time step (also referred to as a clock cycle). In other words, when the content of the second row of a given dial 102 is shifted to the first row of the given dial 102, the content of the first row of the given dial 102 is shifted to the last row of the given dial 102. Moreover, during a cyclic shift, the content of the last row of the given dial 102 can be replaced by the (n−k)-bit wide null vector, an operation referred to herein as a 'shift-up'. After a shift-up operation has taken place, the following cyclic shifts exclude rows containing null vectors.

Each dial 102 works in conjunction with an index dial 108, which is a n×log$_2$(n)-bit circular shift register that performs the same operations (cyclic shift or shift-up) as the dial 102 in order to keep track of the indices (i) of the noise sequence syndromes ($s_i$). In one embodiment, for a code length of n=128, the index dial 108 is a 128×7-bit circular shift register. Whenever a dial 102 is rotated, its corresponding index dial 108 is also rotated. In one embodiment, the architecture 100 comprises two (2) dials 102, where, for the sake of convenience, the first dial 102 is referred to herein as 'dial 1' and the second dial 102 is referred to herein as 'dial 2'. It should however be understood that, depending on the embodiments, more than two (2) dials as in 102 (and accordingly more than two (2) index dials 108 and multiplexers 110) may be used.

For checking one-bit-flip error patterns, the first dial 102 (i.e. dial 1) is used to store all one bit-flip noise sequence syndromes ($s_i$, i=1 . . . n) and the second dial 102 (i.e. dial 2) contains null vectors. Each row of dial 1 therefore contains a given one bit-flip noise sequence syndrome. FIG. 2 depicts the content of the first and second dials 102 used for evaluating one-bit-flip error patterns. By combining each row of the dials 102 with the syndrome ($H \cdot r^\tau$) of the received vector, all one bit-flip noise sequences can be checked for code book membership (i.e. equation (3) can be computed) in one time step. In particular, the syndrome of the received word is XOR-ed (using XOR gates 104 of FIG. 1B) with each row of the dials 102. In the example of FIG. 2, the syndrome of the received word is XOR-ed with all rows of dial 1 and dial 2 in parallel. The results of the XOR operations are then sent to NOR gates 106 whose outputs feed the encoder 112. If any of the results output by the XOR gates 104 (corresponding to computation of equation (3)) is logical zero (0), the decoder determines the code membership constraint is satisfied and the estimated word is output by the word generator 116. Otherwise, the decoder moves to evaluating two-bit flip error patterns as follows.

FIG. 3A illustrates the content of the first and second dials 102 at the first time step, when checking for two-bit-flips error patterns. As can be seen from FIG. 3A, when evaluating two-bit-flip error patterns, the content of the second dial 102 is set as the image of dial 1 cyclically shifted (i.e. circularly rotated) by one. For example, in the first time step, the first row of dial 1 is $s_1$ and the last row of dial 1 is $s_n$, while the first row of dial 2 is $s_2$ and the last row of dial 2 is $s_1$. By combining each row of the dials 102 with the syndrome of the received vector, n two-bit-flips error patterns can be checked for code book membership (i.e. equation (4) can be computed) in one time step.

In the next time step (shown in FIG. 3B), the content of dial 2 is cyclically shifted (i.e. circularly rotated) by one (1) from the original setting of FIG. 3A in order to generate the next n two-bit-flips error patterns. For example, in the next time step, the first row of dial 1 is $s_1$ and the last row of dial 1 is $s_n$, while the first row of dial 2 is $s_3$ and the last row of dial 2 is $s_2$ and the row before last of dial 2 is $s_1$. It should be understood that, as previously discussed, whenever a dial 102 is rotated, its corresponding index dial 108 is also rotated in order to keep track of the indexes. Observing that $\mathbb{1}_{i,j} = \mathbb{1}_{j,i}$, all $$\binom{n}{2}$$

two-bit-flips error patterns are tested for codebook membership after a total of $$\left\lfloor \frac{n}{2} \right\rfloor - 1$$

cyclic shifts from the original setting of FIG. 3A. In particular, for a code length of n=128, all $$\binom{128}{2} = 8128$$

two-bit-flips error patterns are tested for codebook membership after a total of 63 cyclic shifts from the original setting of FIG. 3A. Hence, a total of $$\left\lfloor \frac{n}{2} \right\rfloor$$

(e.g., 64 for a code length of n=128) time steps are required to compute equation (4), where the content of dial 2 is rotated by one (1) at each time step. If any of the results output by the XOR gates 104 (corresponding to computation of equation (4)) is logical zero (0), the decoder determines that the code membership constraint is satisfied and the estimated word is output by the word generator 116. Otherwise, the decoder moves to evaluating three-bit flip error patterns as follows.

Referring now to FIG. 4A, FIG. 4B, FIG. 4C, and FIG. 4D, the two (2) dials as in 102 are used for checking three-bit-flips error patterns. In one embodiment, using the two (2) dials 102 may allow to simplify the architecture 100. Indeed, if three (3) dials were to be used, the scheduling and the associated hardware may become more complex to avoid error pattern duplications. Instead, it is proposed herein to use the controller 114 in conjunction with the dials 102 in order to generate three bit-flip candidate error patterns. The controller 114 takes care of the first bit-flip, while the dials 102 are responsible for considering the two other bit-flips. FIG. 4A shows the content of the dials 102 and the syndrome output by the controller 114 to generate n−1 (e.g., 127 for a code length of n=128) three-bit-flips error patterns at the first time step. As can be seen from FIG. 4A, at the initialization, dial 1 is shifted-up by 1, while dial 2 is shifted-up by 1 and cyclically shifted by 1. For example, in the first time step, the controller 114 outputs $s_1$. The first row of dial 1 is $s_2$, the last row of dial 1 is 0, and the row before last of dial 1 is $s_n$. The first row of dial 2 is $s_3$, the last row of dial 2 is 0, and the row before last of dial 2 is $s_2$. In other words, dial 2 is a copy of dial 1 circularly rotated by 1.

In the next time step (shown in FIG. 4B), the controller outputs $s_1$ and dial 2 is cyclically shifted by 1 to generate the next n−1 (e.g., 127 for a code length of n=128) three bit-flip noise sequences. For example, in the next time step, the first row of dial 1 remains $s_2$, the last row of dial 1 remains 0, and the row before last of dial 1 remains $s_n$. The first row of dial 2 becomes $s_4$, the last row of dial 2 is 0, and the row before last of dial 2 is $s_3$. After $$\left\lfloor \frac{n-1}{2} \right\rfloor$$

(e.g., 63 for a code length of n=128) time steps, a total of $$\binom{n-1}{2}$$

(e.g., 8001 for a code length of n=128) three-bit-flips error patterns, are generated with the first bit-flip noise sequence syndrome $s_1$ remaining fixed.

As shown in FIG. 4C, in the next time step (e.g., sixty-fourth ($64^{th}$) time step for a code length of n=128), the controller 114 outputs the second bit-flip noise sequence syndrome $s_2$ (i.e. the second bit-flip noise sequence syndrome $s_2$ remains fixed) while dial 1 is shifted-up by 1 and dial 2 is reset, shifted-up by 2 and cyclically shifted by 1. For example, in the $64^{th}$ time step, the controller 114 outputs $s_2$. The first row of dial 1 is $s_3$, the first row of dial 2 is $s_4$, and the last two rows of dial 1 and dial 2 are 0. This generates n−2 unique three-bit-flips error patterns, as shown in FIG. 4C.

In the next (i.e. sixty-fifth ($65^{th}$)) time step, dial 2 is cyclically shifted by 1, allowing to generate the next n−2 (e.g., 126 for a code length of n=128 three-bit-flips error patterns as shown in FIG. 4D. For example, in the $65^{th}$ time step, the controller 114 still outputs $s_2$, the first row of dial 1 remains $s_3$, the first row of dial 2 becomes $s_5$, and the last two rows of dial 1 and dial 2 remain 0. Hence, $$\left\lfloor \frac{n-2}{2} \right\rfloor$$

(e.g., 63 for a code length of n=128) time steps are used to generate all $$\binom{n-2}{2}$$

(e.g., 7875 for a code length of n=128) three-bit-flips error patterns (i.e. to compute equation (5)) with the second bit-flip noise sequence $s_2$ fixed and the first bit-flip noise sequence $s_1$ excluded. The process is repeated (not shown) until $s_{n-2}$ (e.g., the $126^{th}$ bit-flip noise sequence for a code length of n=128) is output by the controller 114, where only one three-bit-flips error pattern (H·r$^\tau$⊕H·$s_{n-2}^\tau$⊕H·$s_{n-1}^\tau$⊕H·$s_n^\tau$) is generated. Thus, in one embodiment, using the architecture 100, checking for all three-bit-flips error patterns requires $$\sum_{i=2}^{n-1} \left\lceil \frac{i}{2} \right\rceil = 4032$$

time steps.

In summary, in one embodiment, the number of time steps necessary to check all error patterns with Hamming weights of 3 or less is given by:

$$2 + \sum_{i=2}^{n} \left\lfloor \frac{i}{2} \right\rfloor \quad (6)$$

The ratio between equations (2) and (6), which expresses the parallelization factor for the proposed architecture 100, may be approximated by $$\frac{2*n}{3}.$$

Thus, in one embodiment, the longer the code, the higher the savings compared with a conventional and serial approach.

Referring back to FIG. 1B, as described herein above, each of then (e.g., 128) test syndromes generated at the output of the dials 102 is NOR-reduced (using a corresponding NOR gate 106), to feed the encoder 112. The output of each NOR-reduce gate 106 is logical one (1) if all the bits of the syndrome computed by a given dial 102 are logical zero (0). The output of the priority encoder 112 then controls the multiplexers 110, which are used to forward the indices associated with the valid syndrome to the word generator 116. Finally, the word generator 116 combines the hard decision vector r and the indices output by the controller 114 and the two multiplexers 110 to produce the estimated word x̂.

In one embodiment, the proposed architecture 100 requires 4098 time steps for checking all bit-flips up to AB=3 for a linear code of length n=128 and with a rate (R) greater than or equal to 0.75, given the parity check matrix (H). The architecture 100 may thus allow to perform the 349632 queries of GRANDAB (AB=3) in less time than conventional approaches. In one embodiment, the proposed architecture 100 may demonstrate only a fraction (substantially 1.2% in one embodiment) of the total number of queries performed by GRANDAB as latency. In other words, lower average latency and higher decoding throughput may be achieved compared to existing techniques. In addition, in one embodiment, due to the use of circular shifting for the generation of error patterns as described herein, fewer hardware resources may be allocated for the proposed architecture 100 than for conventional approaches. In one embodiment, the systems and methods described herein may therefore result in decoder speed gains and simplified decoder hardware design.

While the architecture 100 is described herein for decoding data and correcting the noise that alters the channel input at the bit level, it should be understood that the systems and methods described herein may also be applied at the network level. For this purpose, the architecture 100 may be combined with any suitable error correction technique, such as the Random Linear Network Coding (RLNC) technique.

Figure 5:
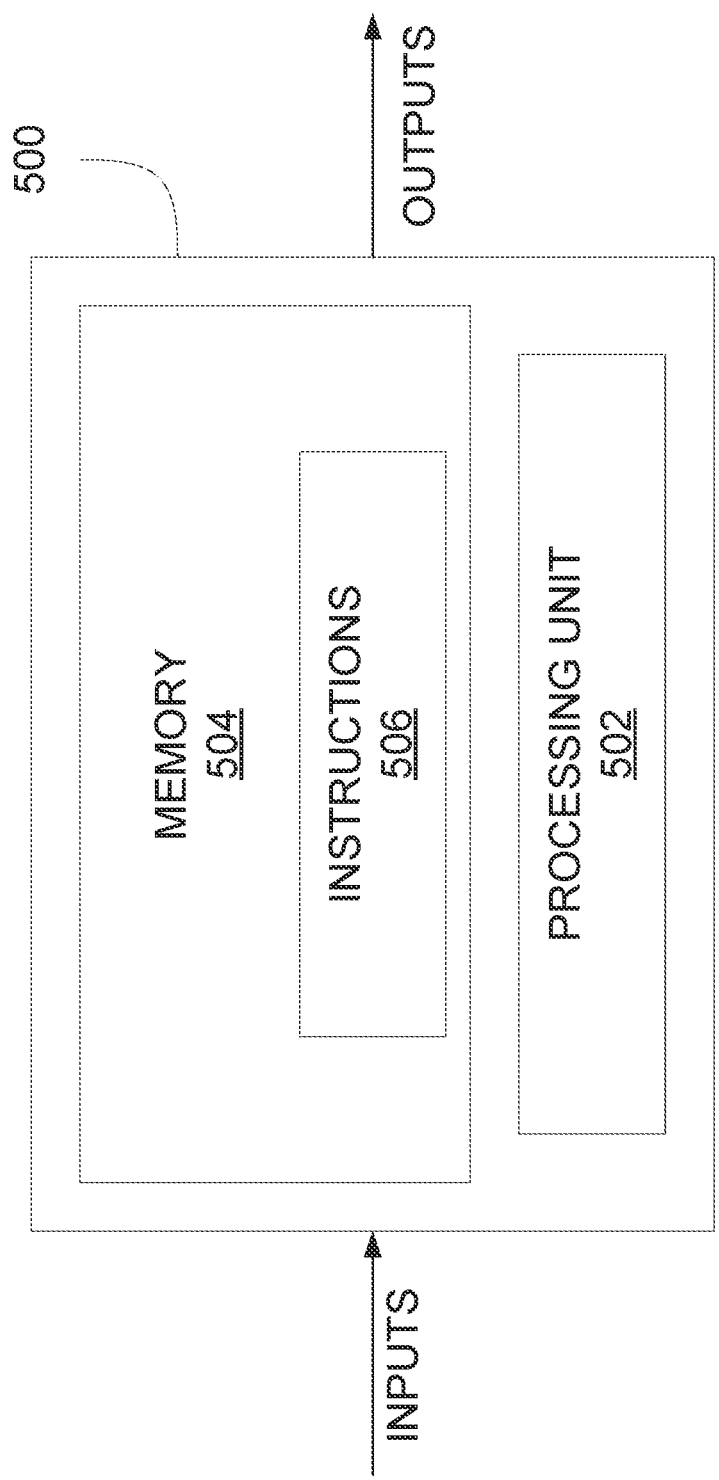
FIG. 5 is a schematic diagram of an example computing system for implementing the method of FIG. 2, in accordance with an illustrative embodiment.

FIG. 5 is an example embodiment of a computing device 500 for implementing one or more components of the data receiver 10 of FIG. 1A and one or more components of the architecture 100 (including, but not limited to, the controller 114, the encoder 112, and/or the word generator 116) described above with reference to FIG. 1B. The computing device 500 comprises a processing unit 502 and a memory 504 which has stored therein computer-executable instructions 506. The processing unit 502 may comprise any suitable devices configured to cause a series of steps to be performed such that instructions 506, when executed by the computing device 500 or other programmable apparatus, may cause the functions/acts/steps specified in the method described herein to be executed. The processing unit 502 may comprise, for example, any type of general-purpose microprocessor or microcontroller, a digital signal processing (DSP) processor, a CPU, an integrated circuit, a field programmable gate array (FPGA), a reconfigurable processor, other suitably programmed or programmable logic circuits, or any combination thereof.

The memory 504 may comprise any suitable known or other machine-readable storage medium. The memory 504 may comprise non-transitory computer readable storage medium, for example, but not limited to, an electronic, magnetic, optical, electromagnetic, infrared, or semiconductor system, apparatus, or device, or any suitable combination of the foregoing. The memory 504 may include a suitable combination of any type of computer memory that is located either internally or externally to device, for example random-access memory (RAM), read-only memory (ROM), electro-optical memory, magneto-optical memory, erasable programmable read-only memory (EPROM), and electrically-erasable programmable read-only memory (EEPROM), Ferroelectric RAM (FRAM) or the like. Memory 504 may comprise any storage means (e.g., devices) suitable for retrievably storing machine-readable instructions 506 executable by processing unit 502.

Figure 6:
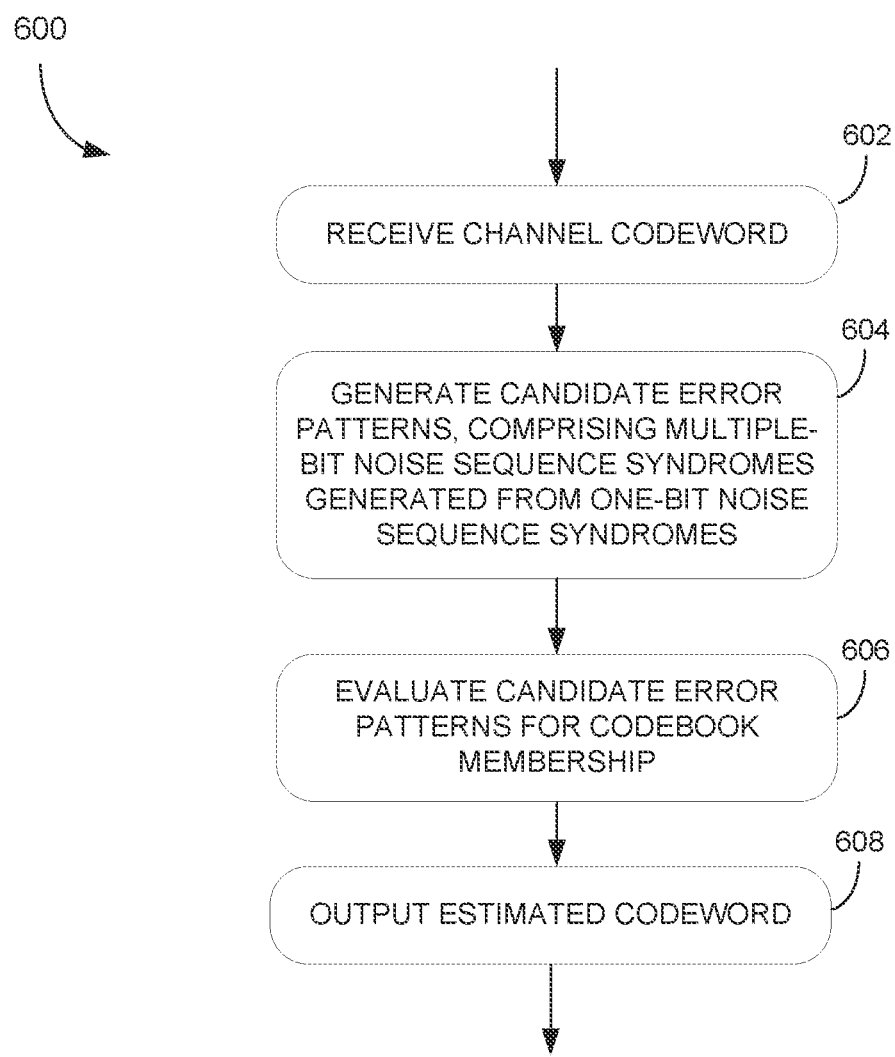
FIG. 6 is a flowchart of a method for decoding data, in accordance with an illustrative embodiment.

Referring now to FIG. 6, a method 600 for decoding data using GRAND will now be described. The method 600 may be performed by a single data receiver (as in data receiver 10 of FIG. 1A) or by multiple data receivers in parallel. The method steps may represent computer software instructions (or groups of instructions) or processes or steps performed by functionally equivalent circuits (e.g., an application specific integrated circuit (ASIC), a digital signal processor (DSP) circuit, or the like). The method 600 comprises receiving a channel codeword at step 602. Candidate error patterns are then generated at step 604, the error patterns comprising multiple-bit (e.g., two-bit and three-bit) noise sequence syndromes generated from one-bit noise sequence syndromes, using circular shift registers as described herein with reference to FIG. 1B to FIG. 4D. The candidate error patterns are then evaluated for codebook membership at step 606 and an estimated codeword is output at step 608. In one embodiment, the candidate error patterns are evaluated for codebook membership sequentially (i.e. one after another) at step 606. This may allow space savings, leading to a compact design. It should however be understood that, in other embodiments, the candidate error patterns may be evaluated for codebook membership using parallel processing (where all error patterns are evaluated concurrently) or semi-parallel processing (where some but not all error patterns are evaluated concurrently). Parallel and semi-parallel processing may allow to reduce computational speed and computing resources.

Figure 7:
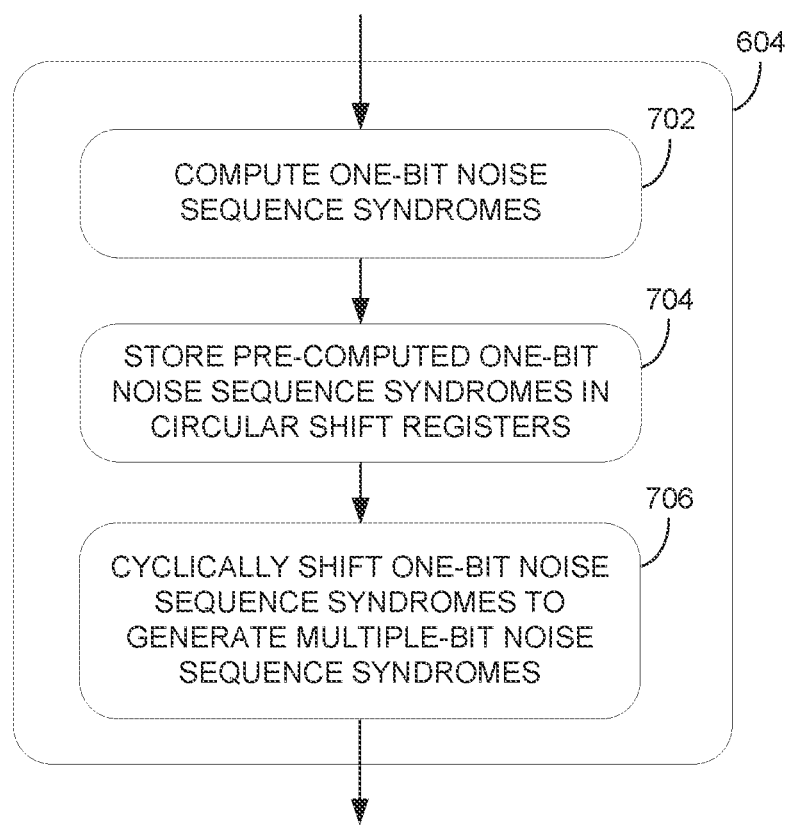
FIG. 7 is a flowchart of the step of FIG. 6 of generating candidate error patterns, comprising multiple-bit noise sequence syndromes generated from one-bit noise sequence syndromes, in accordance with an illustrative embodiment.

Referring now to FIG. 7, the step 604 of generating candidate error patterns comprises computing one-bit noise sequence syndromes at step 702 and storing the one-bit noise sequence syndromes computed at step 702 in circular shift registers. The next step 706 is then to cyclically shift the one-bit noise sequence syndromes (i.e. circularly rotate the contents of the circular shift registers in the manner described herein above with reference to FIG. 2 to FIG. 4D) to generate multiple-bit noise sequence syndromes.

Figure 8:
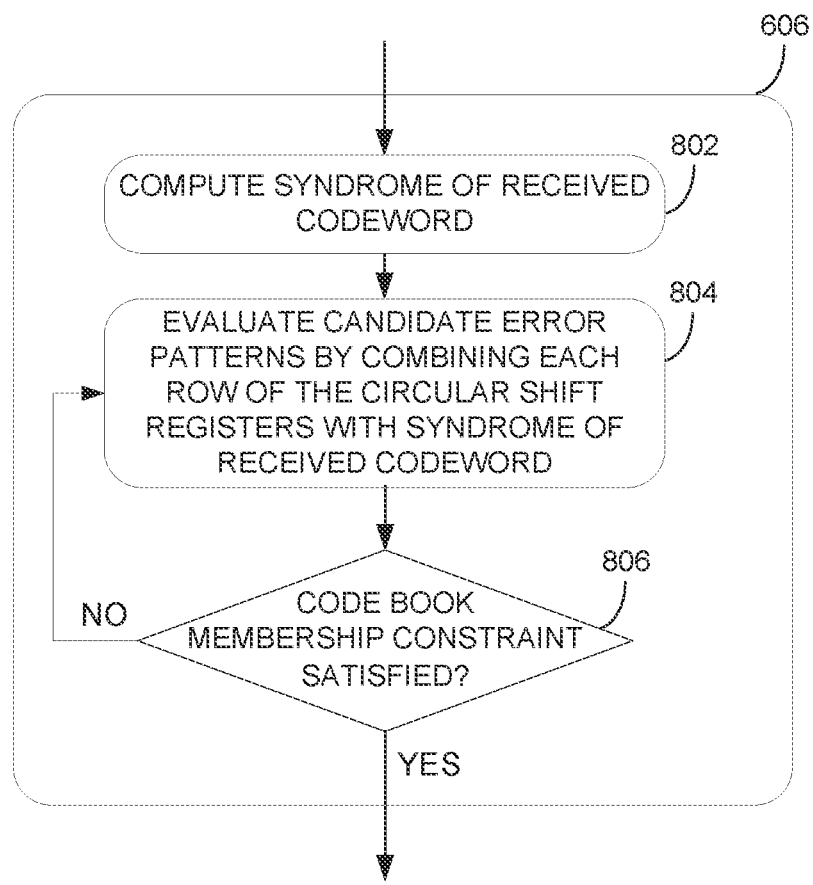
FIG. 8 is a flowchart of the step of FIG. 7 of evaluating candidate error patterns for codebook membership, in accordance with an illustrative embodiment.

Referring now to FIG. 8, the step 606 of evaluating the candidate error patterns for codebook membership comprises computing the syndrome of the received codeword at step 802. The candidate error patterns are then evaluated at step 804 by combining each row of the circular shift registers with the syndrome of the received codeword computed at step 802, as described herein above. In particular, one bit-flip noise sequence syndromes are used for checking the codebook membership constraint for all two-bit flip and three bit-flip noise sequences respectively. The next step 806 is then to assess whether the codebook membership constraint is satisfied. If this is the case, the method 600 proceeds to step 608. Otherwise, the method 600 flows back to the step 804 of evaluating candidate error patterns. In particular, step 804 comprises checking noise sequences with one bit-flip, followed by checking noise sequences with two bit-flips, then by checking noise sequences with three bit-flips. It should be understood that the number of time steps required to perform the method 100 increase with the number of bit-flips considered. When step 804 is performed, as soon as equation (1) above is equal to zero (0), meaning that the codebook membership constraint is satisfied as assessed at step 806, the corresponding estimated word is output at step 608, in the manner described herein above.

While illustrated in the block diagrams as groups of discrete components communicating with each other via distinct data signal connections, it will be understood by those skilled in the art that the present embodiments are provided by a combination of hardware and software components, with some components being implemented by a given function or operation of a hardware or software system, and many of the data paths illustrated being implemented by data communication within a computer application or operating system. The structure illustrated is thus provided for efficiency of teaching the present embodiment.

It should be noted that the present invention can be carried out as a method, can be embodied in a system, and/or on a computer readable medium. The embodiments of the invention described above are intended to be exemplary only. The scope of the invention is therefore intended to be limited solely by the scope of the appended claims.

The invention claimed is:

1. A method comprising:
at a data receiver:
receiving a channel codeword from a data sender over a noisy data channel;
generating a plurality of candidate error patterns, the plurality of candidate error patterns comprising a plurality of one-bit error patterns and a plurality of multiple-bit error patterns generated from the plurality of one-bit error patterns;
evaluating the plurality of candidate error patterns for codebook membership, based on the channel codeword; and
outputting an estimated codeword when a codebook membership constraint is satisfied for a given candidate error pattern.

2. The method of claim 1, wherein generating the plurality of candidate error patterns comprises:
computing a plurality of one-bit noise sequence syndromes associated with the plurality of one-bit error patterns;
storing the plurality of one-bit noise sequence syndromes in a plurality of circular shift registers; and
cyclically shifting the content of the plurality of circular shift registers to combine the plurality of one-bit noise sequence syndromes and accordingly generate the plurality of multiple-bit error patterns.

3. The method of claim 2, wherein the plurality of one-bit noise sequence syndromes is stored in a first circular shift register and a second circular shift register.

4. The method of claim 2, wherein evaluating the plurality of candidate error patterns for codebook membership comprises:
computing a syndrome of the channel codeword;
combining a content of the plurality of circular shift registers with the syndrome of the channel codeword; and
assessing whether the codebook membership constraint is satisfied for the combination.

5. The method of claim 4, wherein combining the content of the plurality of circular shift registers with the syndrome of the channel codeword comprises using a plurality of XOR gates to perform a logical XOR operation between the syndrome of the channel codeword and each row of the plurality of circular shift registers.

6. The method of claim 5, wherein the codebook membership constraint is satisfied when at least one output of the plurality of XOR gates is logical zero.

7. The method of claim 6, wherein, for candidate error patterns having a Hamming weight of at most three, evaluating the plurality of candidate error patterns comprises evaluating one-bit noise sequence syndromes, followed by evaluating two-bit noise sequence syndromes when the codebook membership constraint fails to be satisfied for the one-bit noise sequence syndromes, followed by evaluating three-bit noise sequence syndromes when the codebook membership constraint fails to be satisfied for the two-bit noise sequence syndromes.

8. The method of claim 1, wherein the plurality of candidate error patterns is evaluated for codebook membership sequentially.

9. The method of claim 1, wherein the plurality of candidate error patterns is evaluated for codebook membership in parallel.

10. The method of claim 1, wherein the plurality of candidate error patterns is evaluated for codebook membership in semi-parallel.

11. A data receiver comprising:
a receiving unit configured for receiving a channel codeword from a data sender over a noisy data channel;
an error pattern generation unit configured for generating a plurality of candidate error patterns, the plurality of candidate error patterns comprising a plurality of one-bit error patterns and a plurality of multiple-bit error patterns generated from the plurality of one-bit error patterns;

a codebook membership evaluation unit configured for evaluating the plurality of candidate error patterns for codebook membership, based on the channel codeword; and an output unit configured for outputting an estimated codeword when a codebook membership constraint is satisfied for a given candidate error pattern.

12. The data receiver of claim 11, wherein the error pattern generation unit is configured for generating the plurality of candidate error patterns by:

computing a plurality of one-bit noise sequence syndromes associated with the plurality of one-bit error patterns;

storing the plurality of one-bit noise sequence syndromes in a plurality of circular shift registers; and cyclically shifting the content of the plurality of circular shift registers to combine the plurality of one-bit noise sequence syndromes and accordingly generate the plurality of multiple-bit error patterns.

13. The data receiver of claim 12, wherein the error pattern generation unit is configured for storing the plurality of one-bit noise sequence syndromes in a first circular shift register and a second circular shift register.

14. The data receiver of claim 12, wherein the codebook membership evaluation unit is configured for evaluating the plurality of candidate error patterns for codebook membership by:

computing a syndrome of the channel codeword;

combining a content of the plurality of circular shift registers with the syndrome of the channel codeword; and assessing whether the codebook membership constraint is satisfied for the combination.

15. The data receiver of claim 14, wherein the codebook membership evaluation unit is configured for combining the content of the plurality of circular shift registers with the syndrome of the channel codeword using a plurality of XOR gates to perform a logical XOR operation between the syndrome of the channel codeword and each row of the plurality of circular shift registers.

16. The data receiver of claim 15, wherein the codebook membership evaluation unit is configured to determine that the codebook membership constraint is satisfied when at least one output of the plurality of XOR gates is logical zero.

17. The data receiver of claim 15, wherein, for candidate error patterns having a Hamming weight of at most three, the codebook membership evaluation unit is configured for evaluating the plurality of candidate error patterns comprising evaluating one-bit noise sequence syndromes, followed by evaluating two-bit noise sequence syndromes when the codebook membership constraint fails to be satisfied for the one-bit noise sequence syndromes, followed by evaluating three-bit noise sequence syndromes when the codebook membership constraint fails to be satisfied for the two-bit noise sequence syndromes.

18. The data receiver of claim 11, wherein the codebook membership evaluation unit is configured for evaluating the plurality of candidate error patterns for codebook membership sequentially.

19. The data receiver of claim 11, wherein the codebook membership evaluation unit is configured for evaluating the plurality of candidate error patterns for codebook membership in parallel.

20. The data receiver of claim 11, wherein the codebook membership evaluation unit is configured for evaluating the plurality of candidate error patterns for codebook membership in semi-parallel.

* * * * *